United States Patent [19]

Chen

[11] Patent Number: 5,538,924
[45] Date of Patent: Jul. 23, 1996

[54] METHOD OF FORMING A MOISTURE GUARD RING FOR INTEGRATED CIRCUIT APPLICATIONS

[75] Inventor: Chung-zen Chen, Hsinchu, Taiwan

[73] Assignee: Vanguard International Semiconductor Co., Hsinchu, Taiwan

[21] Appl. No.: 523,792

[22] Filed: Sep. 5, 1995

[51] Int. Cl.⁶ .................................................. H01L 21/465
[52] U.S. Cl. ........................ 437/246; 437/195; 437/191; 437/193; 437/922; 148/DIG. 55
[58] Field of Search ..................................... 437/195, 191, 437/192, 193, 186, 245, 246, 922; 148/DIG. 55

[56] References Cited

U.S. PATENT DOCUMENTS

| 4,536,949 | 8/1985 | Takayama | 437/922 |
| 4,628,590 | 12/1986 | Udo et al. | 148/DIG. 55 |
| 4,795,720 | 1/1989 | Kawanabe | 437/922 |

FOREIGN PATENT DOCUMENTS

| 0531128 | 3/1993 | European Pat. Off. | |
| 0062544 | 4/1982 | Japan | 437/922 |
| 0147647 | 5/1992 | Japan | 437/922 |

Primary Examiner—Trung Dang
Attorney, Agent, or Firm—George O. Saile; William J. Stoffel

[57] ABSTRACT

An improved structure and method for forming an integrated circuit guard ring which prevents contamination/moisture from diffusing through a fuse opening, in the insulating layer(s), to device areas, is described. A first insulating layer is formed over portions of the substrate. A gate insulating layer is formed surrounding the first insulating layer. The first ring surrounds a fuse area—including the area where the fuse will be cut by a laser or burned by a current. A first dielectric layer is formed over the substrate surface. A first passivation layer is then formed over the first insulating layer. A first opening is formed through the first passivation layer and first dielectric layer over the first ring. A fuse is formed over the first passivation layer over the fuse area and a second ring of water impervious material is formed on the first ring through the first opening. The first and second rings form a moisture impervious seal. A second insulating layer is then formed over the fuse and the first insulating layer. A fuse opening is etched over at least the fuse area through the second insulating layer and can expose the fuse. A second passivation layer is formed over the second insulating layer and the fuse.

9 Claims, 5 Drawing Sheets

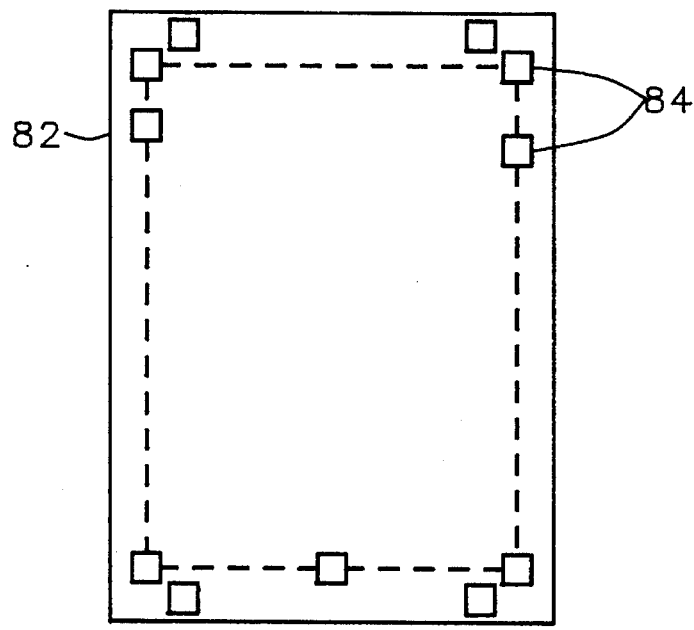
FIG. 1A
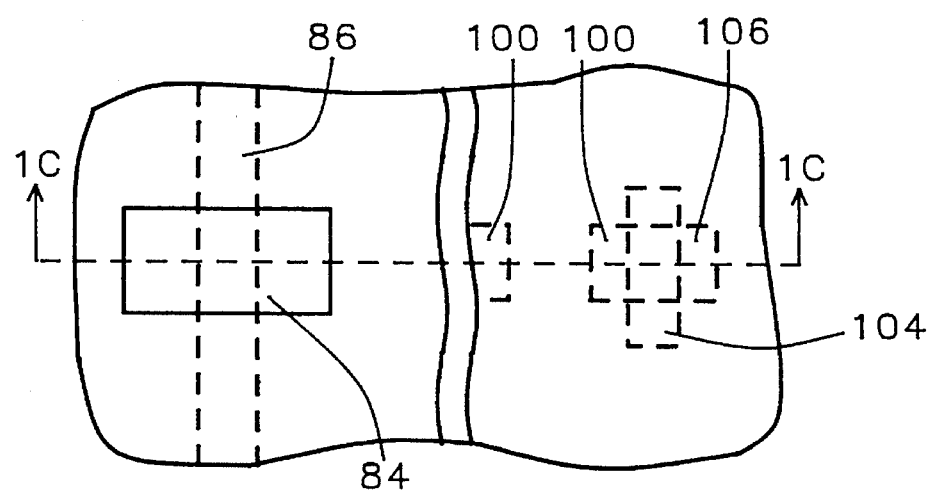
FIG. 1B – Prior Art

FIG. 1C – Prior Art

METHOD OF FORMING A MOISTURE GUARD RING FOR INTEGRATED CIRCUIT APPLICATIONS

BACKGROUND OF INVENTION

1) Field of the Invention

This invention relates to integrated circuits and semiconductor devices. It relates particularly to a structure and method for producing integrated circuits having improved moisture and contamination guard rings surrounding openings in insulating layers, such as fuse openings.

2) Description of the Prior Art

Fuses can be used to rewire memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

An important challenge is to improve the reliability and yields of the semiconductor devices surrounding openings in insulating layers, such as openings over fusible links. A problem with openings is that moisture and other contaminants can diffuse from the openings into the device areas thus reducing circuit reliability and yields.

FIG. 1A shows a top plan view of a semiconductor chip 82 with openings 84 through the insulating layers called fuse (cutting) openings 84. Also, a semiconductor chip 82 sometimes contains openings over alignment marks which are used to align the laser repair machine and other tools.

FIG. 1B shows a conventional fusible link region and an adjacent device region in a top down view. FIG. 1C shows a cross-sectional view of the same link and device regions taken along horizontal axis labeled 1C in FIG. 1B. Fuse 86 can be formed of a metal.

Fuse 86 is often formed over thick field oxide regions 88 in semiconductor substrate 10 as shown in FIG. 1C. Fuse 86 is formed over the field oxide regions 88 to prevent shorting of the fuse 86 to the substrate 10 through a thinner insulating layer. Layers 90, 92, 94, are insulating layers. Opening 84 is formed over the fuse area through the insulating layers 90, 92, 94. An adjacent semiconductor device is shown with buried doped regions 100 106, gate oxide 102, gate 104, via 110 and metal layers 108, 112. The fuse 86 is shown in FIG. 1C with a hole 83 formed after the fuse was "blown" (i.e., cut or heated) by a laser. Contamination can diffuse through the hole 83 into the field oxide layer 88 and then into the other insulating layers 90, 92, 94 to the devices 100, 102, 106.

There are two methods for blowing fuses: (a) using a laser and (b) passing a high current through the fuse. The portion of the fuse and thin insulating layer which is melted away or "blown" should not deposit on or interfere with near-by devices.

A laser is often used to break the fuse forming an electrical open by heating the fuse to a high temperature. It is conventional to have an opening 84 over the fuse in the area where the fuse will be broken so that the laser heating will be more effective. In addition, openings are often formed over alignment marks which are used to align the laser on the correct portion of the fuse to be blown. The alignment mark openings in the passivation layers are formed so that the alignment marks can be clearly viewed.

A major problem with any window opening in the passivation layers is that moisture and contamination can enter through the exposed insulation layers and diffuse to the semiconductor devices. The diffused moisture and contaminates can decrease reliability and yields. Moisture is present in the air and sodium (Na+ions) is plentiful in the environment.

As shown in FIG. 1C, moisture and other contaminants can enter through the hole 83 into layer 88 and diffuse to the adjacent semiconductor devices. Water will attack the metal via 110, with the following reaction:

$$3\ H_2O + Al \rightarrow Al(OH)_3 + 3/2 H_2$$

The moisture corrodes the metal causing the resistance of metal via's 110 to increase and finally cause circuit failure. Mobile ions, such as sodium ions, can diffuse through insulating layers 90, 92, 94 and field oxide layer 88. Mobile ions in the field oxide layer 88 can also cause field inversion. The field inversion causes undesired leakage current between adjacent buried doped regions 100. Also, mobile ions in the gate oxide 102 will cause a transistor threshold shift whereby the circuit fails. Furthermore, moisture can cause the insulating layers to delaminate causing circuit failure.

The following U.S. patent shows a fusible link structure, but do not solve the problem of moisture diffusing through the window opening and the insulating layers. Takayama et al., U.S. Pat. No. 4,536,949, discloses a method of forming an opening in insulating layers over a fuse. The opening is formed by etching each insulating layer over the fuse after the insulating layer is formed. However, this does not solve the problem of contaminates entering the fuse opening and defusing to the adjacent semiconductor devices.

SUMMARY OF THE INVENTION

It is a general object of the invention to provide an improved structure and method for forming an integrated circuit guard ring which prevents contamination/moisture from diffusing from a fuse opening in the insulating layer(s) to device areas.

A more specific object of the present invention is to provide an improved structure and method for forming an integrated circuit guard ring which prevents contamination from diffusing to semiconductor devices through a fuse opening in the insulating layer(s) over a fuse.

In accordance with the above objects, a structure and technique for forming an integrated circuit guard ring is provided. The method begins by forming a first insulating layer over portions of the substrate. A gate insulating layer is then formed surrounding the first insulating layer. Next, a first ring of water impervious material is formed on the gate insulating layer. The first ring surrounds a fuse area— including the area where the fuse will be cut by a laser or burned by a current. A first dielectric layer is formed over the substrate surface. A first passivation layer is then formed over the first insulating layer. A first opening is formed through the first passivation layer and first dielectric layer over the first ring.

A fuse is formed over the first passivation layer over the fuse area and a second ring of water impervious material is formed on the first ring through the first opening. The first and second rings form a moisture impervious seal.

A second insulating layer is then formed over the fuse and the first insulating layer. A fuse opening is etched over at least the fuse area through the second insulating layer and can expose the fuse. A second passivation layer is formed over the second insulating layer and the fuse.

The configuration of the first passivation, first ring, second ring, and the gate insulating layer under the first ring forms a barrier to moisture which can enter through a hole in the second passivation layer 38 after the fuse is blown. This barrier keeps the moisture away from the devices located outside of the rings.

In a second embodiment of the present invention, the fuse and the first ring are formed during the same process deposition step. The fuse is formed over the first insulating layer, but under the first dielectric layer. See FIG. 6. Also the fuse opening extends through the second insulating layer, but does not extend through the first passivation layer.

For the first embodiment in operation, a laser cuts the fuse 28 possibly breaking through the first passivation layer 24 forming a hole 86. Moisture can enter through this hole. The two rings and the passivation layers form a moisture impervious boundary preventing moisture form diffusing from the hole to other devices as shown in FIG. 3. If the first passivation layer is not broken, the remaining fuse and the first passivation layer protect the devices from contamination.

BRIEF DESCRIPTION OF THE DRAWINGS

The drawings show the following:

FIG. 1A is a top plan view in greatly enlarged scale that illustrates a semiconductor chip with openings in accordance with the prior art.

FIG. 1B is a top plan view in greatly enlarged scale that illustrates an opening for a fuse and adjacent devices in accordance with the prior art.

FIG. 1C is a cross sectional view along axis 1C in FIG. 1B showing a fuse opening, a fuse, and adjacent devices in accordance with the prior art.

FIG. 3 is taken along axis 3 in FIG. 2.

FIG. 4 is taken along axis 4 in FIG. 2.

DETAILED DESCRIPTION OF THE PREFERRED EMBODIMENTS

Figure 2:
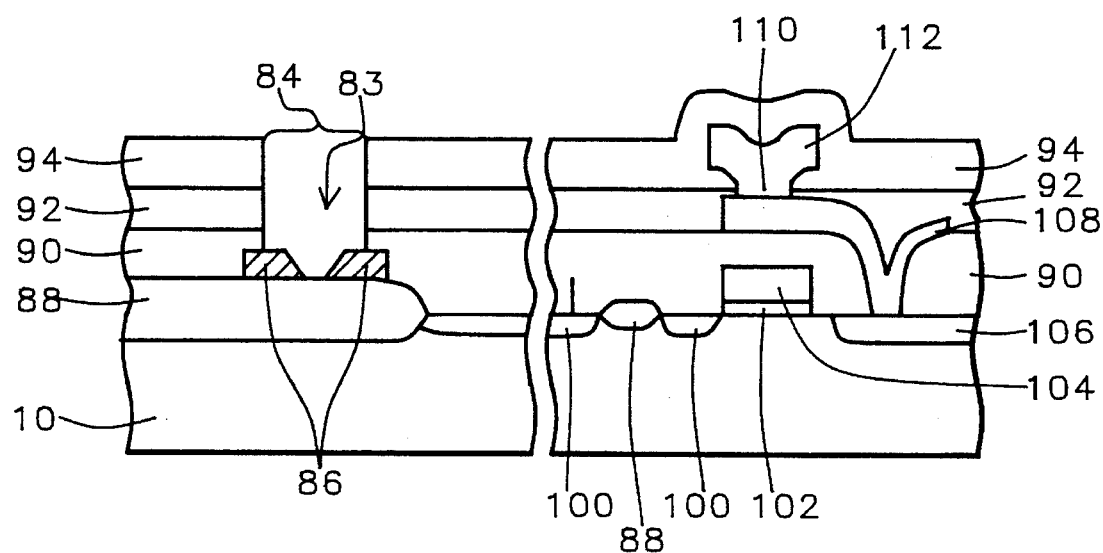
FIG. 2 is top plan view in broken section in greatly enlarged scale that illustrates a fuse, fuse opening, and guard ring in accordance with the present invention.
Figure 2:
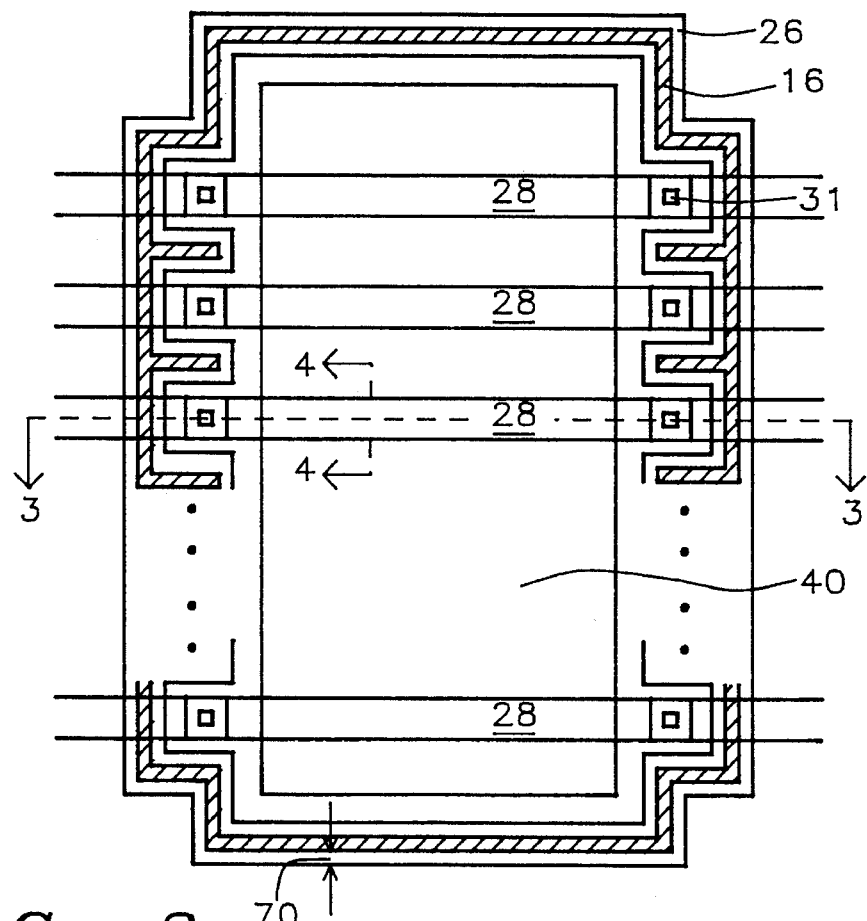
Figure 3:
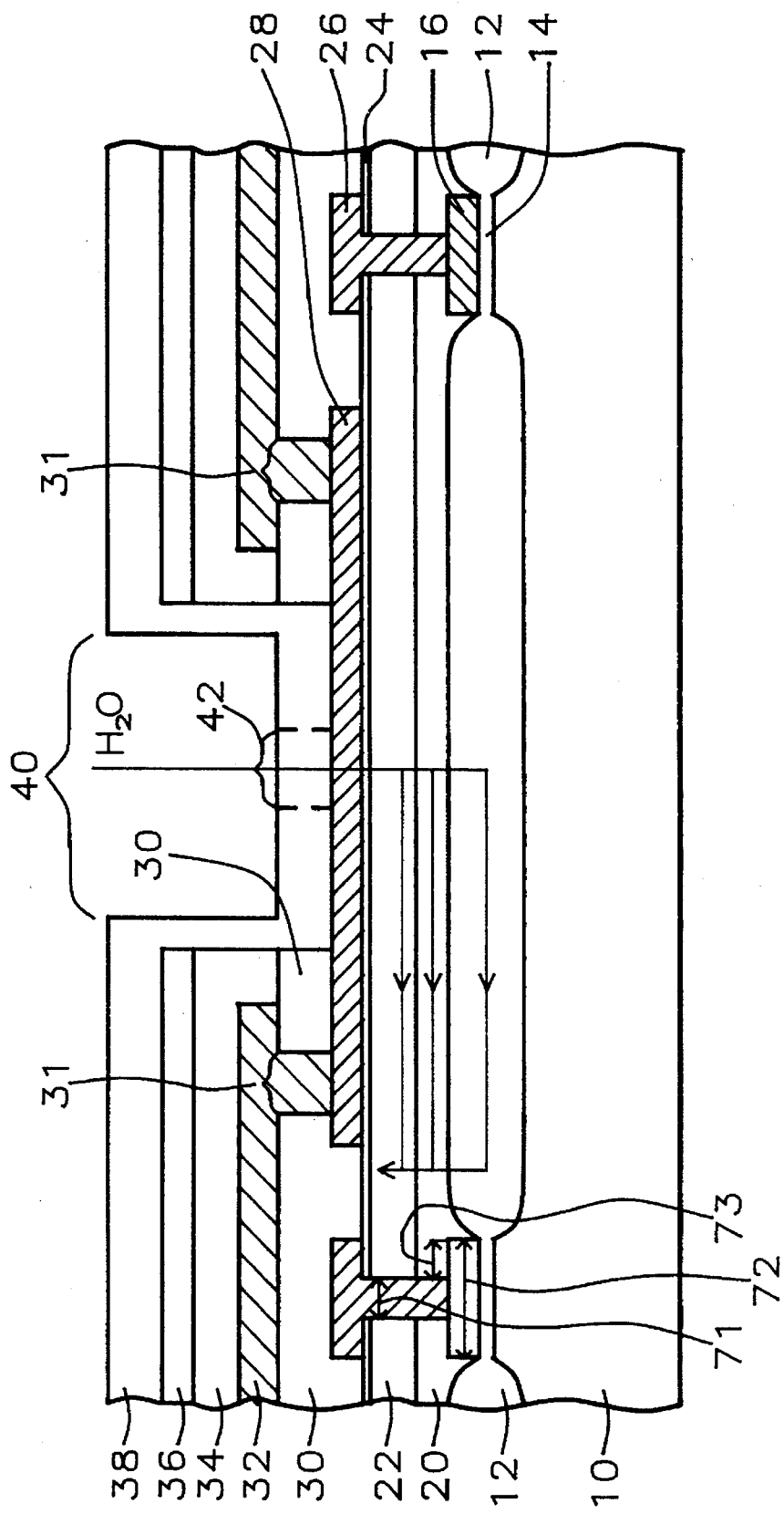
FIG. 3 is cross-sectional view in broken section in greatly enlarged scale that illustrates the fuse, fuse opening, metal layer, and the guard ring in accordance with the present invention.
Figure 4:
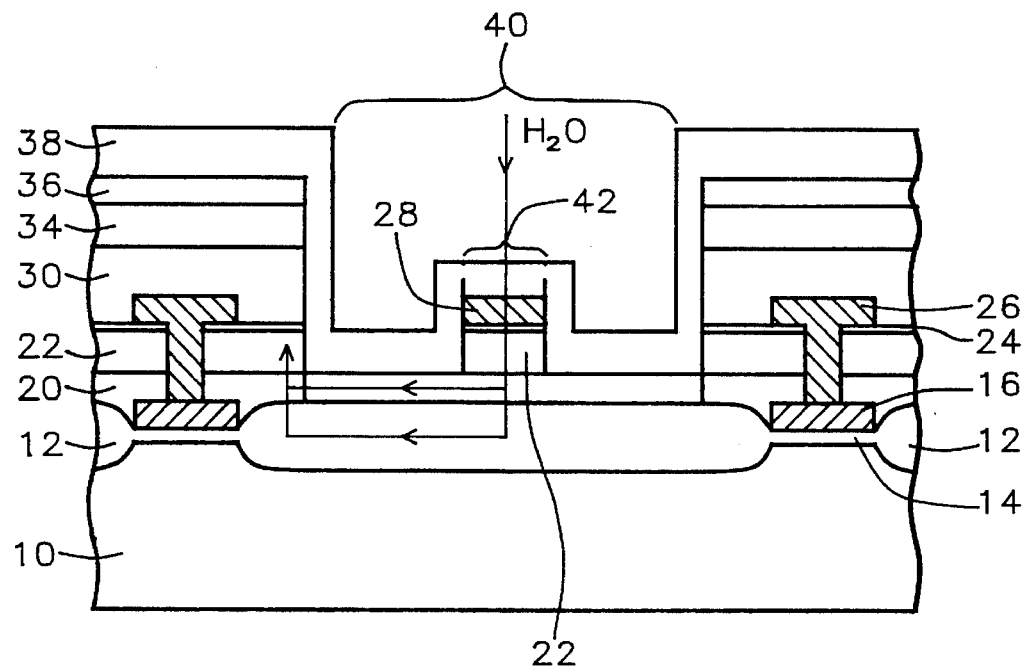
FIG. 4 is cross-sectional view in broken section in greatly enlarged scale that illustrates the fuse, fuse opening and guard ring in accordance with the present invention.

The following detailed description relates to an improved structure and technique for forming guard rings around fuse openings in integrated circuits. As shown in FIG. 2, a guard ring 16, 26 is formed around a fuse opening 40. Fuses 28 cross through the fuse opening 40. The guard ring 26 keeps moisture from diffusing through the various layers into device areas 8. FIGS. 3 and 4 are cross-sectional views through the fuse 28 along axes 3 and 4 as shown in FIG. 2. The fuse 28 can be "burnt" by a laser bean focused on the fuse in the fuse area 42 as shown in FIGS. 3 and 4. The guard ring is composed of a first ring 16 and a second ring 26, both formed of a moisture impervious material. When the fuse 28 is "cut" or "burnt" by the laser or heated by current, the first passivation layer 24 can be broken. As shown in FIG. 3, the moisture is prevented from diffusing pass the guard rings 16 26.

A semiconductor substrate is provided which has semiconductor devices formed within. A fuse area is defined apart from the semiconductor devices. A first insulating layer 12 is formed over at least the fuse area of the substrate as shown in FIGS. 3 and 4. The first insulating layer 12 can be a field oxide layer composed of silicon oxide with a thickness in range of about 3000 to 5000 Å. The first gate insulating layer 12 can be comprised of a thick field oxide layer underlying at least a fuse area 42. The first insulating layer 12 is surrounded by a gate insulating layer 14. The gate insulating layer 12 is formed on the substrate surface and formed beneath the first ring 16. The thin insulating layer 14 has a thickness in the range of about 50 to 500 Å. The gate insulating layer 14 can be formed in a separate oxidation step after the formation of the thick areas (FOX) of the first insulating layer 12.

Next, a first ring 16 composed of a water impervious material is formed on the first insulating layer 12. The first ring 16 can be composed of polysilicon, polycide, or silicide. The first ring 16 surrounds the fuse area 28. The first ring 16 has a thickness in the range of about 2000 to 5000 and more preferably a thickness of about 3000. The first ring 16 has a width 72 in the range of about 1.1 to 1.5 microns and more preferably about 1.1 microns. See FIG. 3.

A first dielectric layer 20 is then formed over the first insulating layer 12 as shown in FIGS. 3 and 4. The first dielectric layer 20 has a thickness in the range between about 1000 to 3000 Å and more preferably a thickness of about 1500 Å. First dielectric layer 20 is preferably formed of a silicon oxide formed by a conventional TEOS (tetraethylorthosilicate) deposition process.

Figure 5:
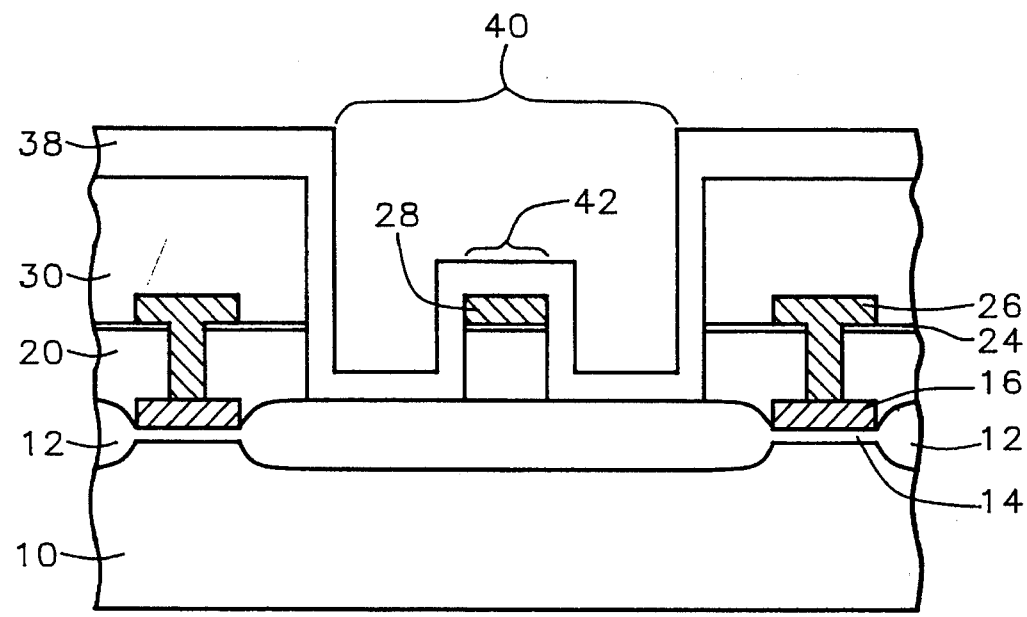
FIG. 5 is cross-sectional view in broken section in greatly enlarged scale that illustrates the fuse, fuse opening and guard ring in accordance with the present invention in a simplified form by combining several insulating layers.

A second dielectric layer 22 can be formed over the first dielectric layer 20. The second dielectric layer 22 can be formed of borophosphosilicate glass (BPSG) or silicon oxide formed by a tetraethylorthosilicate (TEOS) reactant. The second dielectric layer 22 has thickness in the range of about 3000 to 6000 Å and more preferably a thickness of about 4000 Å. Both the first and second dielectric layers are represented in FIG. 5 as layer 20. Also, the first and second dielectric layers are optional layers, (e.g., the first passivation layer 24 can be formed on the first insulating layer 12.

Subsequently, a first passivation layer 24 is formed over the first insulating layer 12. The first passivation layer functions to keep moisture from diffusing from the first insulating layer 12 into other insulating layers 30 34 36 above the first passivation layer 24. The first passivation layer 12 has a thickness in the range of about 200 to 500 Å and more preferably a thickness of about 300 Å. The first passivation layer 24 can be formed by a conventional low pressure chemical vapor deposition process.

A first opening is formed in the first passivation layer 28 and any layers (e.g., 20, 22) between the first passivation layer and the first ring. First opening can be formed by conventional photo and etching processes.

A fuse 28 and second ring 26 are formed in the same process deposition step. Fuse 28 is formed over the first passivation layer 24. The fuse 28 overlies the fuse area 42 where a laser beam can be used to "cut" the fuse. The second ring 26 of water impervious material is formed through the first opening on the first ring 16. Both the fuse 28 and the second ring 26 can be formed in the same process step by forming a layer of moisture impervious material over the substrate surface and then defining the fuse 28 and second ring 26 with a patterning step.

The fuse 28 can be formed of metal, such as aluminum or titanium tungsten, polysilicon, a silicide, such as tungsten silicide, platinum silicide, polysilicon, or a polycide, such as titanium polycide, tungsten polycide or molybdenum polycide. Fuse 28 is preferable formed of a polycide. The preferred process to form fuse 28 with an insitu polysilicon and tungsten silicide process. The fuse 28 has a thickness in the range of about 1500 to 2500 Å and more preferably a thickness of about 2000 Å.

The second ring 26 is formed through the first opening over first ring 16 to form a moisture tight seal. The second ring 26 is formed of polysilicon and polycide. The ring 26 has a thickness in the range of about 1500 to 2500 Å and more preferably a thickness of about 2000 Å. The first ring 16 preferably overlaps 73 the second ring 26 by about 0.3 microns. See FIG. 3. The second ring has a width 71 in the range of about 0.4 to 0.6 microns and more preferably about 0.5 um.

A second insulating layer 30 is formed over the fuse 28 and the first passivation layer 24. See FIG. 5. The second insulating layer 30 can be formed of several layers. For example, FIG. 4 shows the several layers overlying the first passivation layer 24 including the second insulating layer 30, third dielectric layer 34 and fourth dielectric layer 36. The second insulation layer 30 can be formed of any dielectric material and is preferably formed of borophosphosilicate glass (BPSG). The second insulating layer 30 has a thickness in the range of about 3000 to 6000 Å and more preferably a thickness of about 4000 Å. Third dielectric layer 34 can be formed of a sandwich of silicon oxide, spin-on-glass (SOG), and silicon oxide. The silicon oxide layers are preferable formed by a conventional plasma enhanced deposition process. Third dielectric layer 34 has a thickness in the range of about 3000 to 6000 Å and more preferably a thickness of about 4000 Å.

Fourth dielectric layer 36 can be formed of silicon oxide formed by a conventional plasma enhanced process (PEOX). Fourth dielectric layer 36 has a thickness in the range of about 1000 Å to 3000 Å and more preferably a thickness of about 2000 Å. Metal layers can be added between insulating layers are required by the device design.

FIG. 3 shows a first metal layer 32 which contacts the fuse 28 in the contact area 31. First metal layer 32 can be formed of a sandwich structure of Titanium (Ti), titanium nitride (TiN), aluminum silicon copper (AL/Si/Cu), and TiN. First metal layer 32 has a thickness in the range of about 4000 to 7000 Å and more preferably a thickness of about 5000 Å.

Subsequently, a fuse opening 40 is formed over at least the fuse area 42 through the second insulating layer 30 and other overlying layers (e.g., 34, 36). Fuse opening 40 exposes at least portions of the fuse 28, especially the fuse area 42 where a laser can "burn" the fuse 28.

A second passivation layer 38 is then formed over the second insulating layer 30 and the other layers 32, 34, 36 and the fuse 28. The second passivation layer 38 can be formed of silicon nitride and silicon oxide and is preferably formed of silicon nitride. The silicon nitride second passivation layer 38 is preferably formed by a conventional plasma enhanced process. The second passivation layer 38 has a thickness in the range of about 5000 Å to 8000 Å and more preferably a thickness of about 6000 Å.

A simplified representation of the present invention is shown in FIG. 5 where multiple insulating layer described above are shown as combined as one layer. For example, insulating layers 20, 22, (FIG. 3) are shown as insulating layer 20 (FIG. 5). Also, layers 30, 34,36 (FIG. 3) are shown as layer 30. many variation on the number, type and configuration of layer is possible. The thrust of the invention is to use the first and second rings, the first and second passivation layers, and the substrate as a moisture proof barrier.

Figure 6:
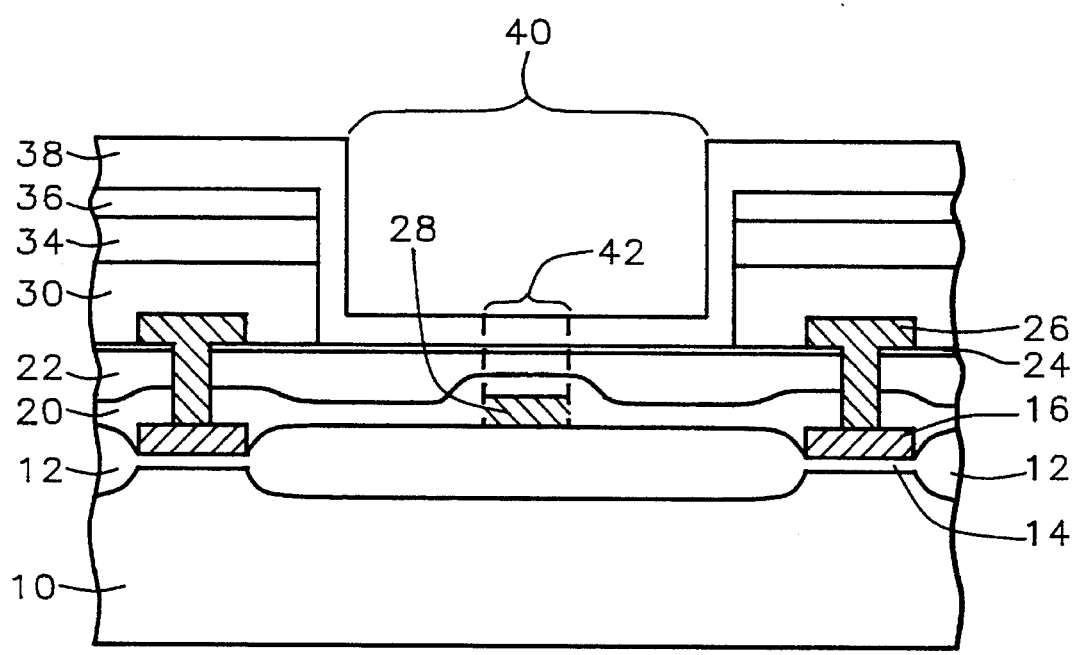
FIG. 6 is cross-sectional view in broken section in greatly enlarged scale that illustrates a second embodiment of the present invention where the fuse is formed on the first insulating layer.

A second embodiment of the present invention is shown in FIG. 6 where the fuse 28 is formed over the first insulating layer 12. The fuse 28 is formed over the first insulating layer 12 but under said first passivation layer 24 and the opening 40 is through the second insulating layer 30 34 36 but does not extend through the first passivation layer 24. The process to form this embodiment is similar to above, except the fuse 28 is formed on or over the first insulating layer 12. The fuse 28 can be then covered by the first and second dielectric layers 20 22.

The first embodiment of the guard ring structure of the present invention is described as follows. See FIG. 5. The invention has a first insulating layer 12 overlying a substrate. A gate insulating layer surrounds the first insulating layer. A first ring 16 of water impervious material is placed over the first insulating layer and surrounds the fuse area 42. A first dielectric layer 20 overlies the first insulating layer 12, the gate insulating layer 14 and the first ring 16. A fuse 28 overlies the first passivation layer 24 and passes over the fuse area.

A second ring 26 of moisture impervious material contacts the first ring 16 through a first opening extending through the first dielectric layer 20 and the first passivation layer 24. The second ring 26 overlaps to the first passivation layer 24 and forms a water proof seal with the first passivation layer.

A second insulating layer (30 in FIG. 5 or 30 34 36 in FIG. 4) is provided over the first passivation layer 24 and over the second ring 26. The second insulating layer has an opening 40 over the fuse area 42. The opening 40 is surrounded by the first and second rings 16 28. A second passivation layer 38 (optional) extends over at least the fuse 28 in the fuse area 42 and over the second insulating layers 30 or 30 34 36. Another embodiment of the present invention is where a laser repair opening is formed through the second passivation layer 38 exposing portion of the fuse. 28.

The two rings 16, 26 and the passivation layers 24 38 form a moisture impervious boundary which prevents moisture from diffusing into other layers and diffuse from the fuse opening 40 to product devices outside the rings as shown in FIG. 3.

A second embodiment of the invention is shown in FIG. 6 where the fuse 28 is formed on the first insulating layer 12. The first dielectric layer 20 and the first passivation layer 24 are formed over the first dielectric layer. A laser can penetrate through the layers over the fuse to burn the fuse. Also, the fuse can be melted with a high current. The moisture that could enter through a break in the first and second passivation layer 24 and 38 is blocked from the product devices by the first and second guard rings as shown in FIG. 6.

The fuse 28 and fuse window 40 described herein could be any structure where an opening is provided through insulating layers, such as an opening for an alignment mark for photolithography or the laser tool. Also, the guard ring can guard a bonding pad.

FIG. 3 shows that the diffusion path for moisture is closed by the guard ring of the present invention. The guard rings 16 26, the passivation layers 24 38 and the substrate create a closed area where the moisture and contamination can't diffuse out of into the product devices. This guard ring will increase yields by reducing metal corrosion, insulating/dielectric layer peeling, and contamination, especially mobile ions. The present invention has the advantage of not introducing any additional masking steps as they can be performed simultaneously with product device masking steps.

While the invention has been particularly shown and described with reference to the preferred embodiments thereof, it will be understood by those skilled in the art that various changes in form and details may be made without departing from the spirit and scope of the invention. For example, it would be obvious to one skilled in the art that the number and combination of insulating and dielectric layers could be varied without effecting the function of the present invention.

What is claimed is:

1. A method of fabricating a guard ring about a fuse opening in a fuse area in a semiconductor substrate comprising:

forming a first insulating layer over at least said fuse area in said substrate;

forming a gate insulating layer on the substrate surface surrounding said first insulating layer;

forming a first ring of water impervious material on said gate insulating layer, said first ring surrounding the fuse area;

forming a first dielectric layer over said first insulating layer, said gate insulating layer, and said first ring;

forming a first passivation layer over the first dielectric layer;

forming a first annular opening through said first dielectric layer and said first passivation layer over said first ring;

forming a fuse over said first passivation layer, said fuse overlying said fuse area;

forming a second ring of water impervious material on said first rings;

forming a second insulating layer over the fuse and the first insulating layer;

forming the fuse opening over at least the fuse area through said second insulating layer and exposing at least said fuse, said fuse opening defining vertical sidewalls of said second insulating layer;

forming a second passivation layer over said second insulating layer and at least over said vertical sidewalls of said second insulating layer and forming a moisture proof seal with said first passivation layer.

2. The method of claim 1 wherein said gate insulating layer has a thickness in the range of about 50 to 500 Å.

3. The method of claim 1 wherein said first and second ring of water impervious material are formed of a material selected from a group consisting of polycide, polysilicon, and tungsten silicide.

4. The method of claim 1 wherein said second ring and said fuse are formed of polysilicon and polycide material.

5. The method claim 1 wherein said second insulating layer is formed of more than one insulating layers.

6. The method of claim 1 wherein said first and second passivation layers are formed of silicon nitride.

7. The method of claim 1 wherein said first and second passivation layers are formed of silicon nitride, said first passivation layer having a thickness in the range of about 200 to 500 and said second passivation layer having a thickness in the range of about 5000 to 8000 Å.

8. The method of claim 1 wherein the fuse is an alignment mark.

9. A method of fabricating a guard ring about a fuse opening in a fuse area in a semiconductor substrate comprising:

forming a first insulating layer over at least said fuse area in said substrate;

forming a gate insulating layer on the substrate surface surrounding said first insulating layer;

forming a fuse on said first insulating layer, said fuse overlying said fuse area;

forming a first ring of water impervious material on said gate insulating layer, said first ring surrounding the fuse area;

forming a first dielectric layer over said first insulating layer, said gate insulating layer, and said first ring;

forming a first passivation layer over the first dielectric layer;

forming a first annular opening through said first dielectric layer and said first passivation layer over said first ring;

forming a second ring of water impervious material on said first ring;

forming a second insulating layer over the fuse and the first insulating layer;

forming the fuse opening over at least the fuse area through said second insulating layer but not extending through said first passivation layer, said fuse opening defining vertical sidewalls of said second insulating layer;

forming a second passivation layer over said second insulating layer and at least over said vertical sidewalls of said second insulating layer and forming a moisture proof seal with said first passivation layer.

\* \* \* \* \*